United States Patent
Suh (10) Patent No.: US 6,334,204 B1
(45) Date of Patent: Dec. 25, 2001

(54) APPARATUS AND METHOD FOR CORRECTING ONE-BIT ERROR OF PARALLEL DIGITAL BUS

(75) Inventor: Dong-Wook Suh, Sungnam (KR)

(73) Assignee: SamSung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/222,681

(22) Filed: Dec. 29, 1998

(30) Foreign Application Priority Data

Dec. 30, 1997 (KR) .................................................. 97-79016

(51) Int. Cl.[7] ............................ G06F 11/00; H03M 13/00
(52) U.S. Cl. ............................................................. 714/801
(58) Field of Search .................................... 714/746, 747, 714/800

(56) References Cited

U.S. PATENT DOCUMENTS

| | | | | |
|---|---|---|---|---|
| 3,659,089 | * | 4/1972 | Payne et al. ........................... | 708/531 |
| 3,699,323 | * | 10/1972 | Reinheimer ........................... | 708/531 |
| 4,298,982 | * | 11/1981 | Auerbach ............................. | 714/746 |
| 4,348,742 | * | 9/1982 | O'Brian ................................ | 714/48 |
| 4,417,339 | * | 11/1983 | Cantarella ............................ | 714/777 |
| 4,429,391 | * | 1/1984 | Lee ....................................... | 714/800 |
| 4,556,978 | * | 12/1985 | Kregness et al. .................... | 714/800 |
| 5,392,299 | * | 2/1995 | Rhines et al. ........................ | 714/756 |

OTHER PUBLICATIONS

"Error Control Systems", Stephen B. Wicker, Prentice Hall, 1995.*

M. Morris Mano, "Digital Logic and Computer Design", Prentice Hall, 1979.*

* cited by examiner

*Primary Examiner*—Albert DeCady
*Assistant Examiner*—Joseph D. Torres
(74) *Attorney, Agent, or Firm*—Robert E. Bushnell, Esq.

(57) ABSTRACT

In a method and apparatus for modifying an error in the case of one-bit error in a parallel digital bus, the original data can be recovered when one of the data bits is fixed as '0' or '1' because of a hardware error, or when one of the data bits has a random value of '0' or '1'. In case of no error, the present invention only endures such overhead as propagation delay, rarely causing a decrease in performance. If the present invention is chosen as a bus specification, such as PCI (in other words, if the present invention is utilized as a bus interface in the bus-using chips), the bus fault tolerance is improved.

9 Claims, 5 Drawing Sheets

APPARATUS AND METHOD FOR CORRECTING ONE-BIT ERROR OF PARALLEL DIGITAL BUS

CLAIM OF PRIORITY

This application makes reference to, incorporates the same herein, and claims all benefits accruing under 35 U.S.C. §119 from an application for METHOD FOR CORRECTING ONE BIT ERROR OF PARALLEL DIGITAL BUS AND APPARATUS THEREOF earlier filed in the Korean Industrial Property Office on the Dec. 30, 1997 and there duly assigned Ser. No. 79016/1997.

BACKGROUND OF THE INVENTION

1. Technical Field

The present invention is related to a parallel digital bus for transmitting data in a digital system. More specifically, the present invention relates to an apparatus and method for correcting a one-bit error occurring in the parallel digital bus so as to maintain the performance of the system.

2. Related Art

Contemporary apparatuses and methods for correcting errors occurring in data transmitted over a parallel digital bus are burdened by serious drawbacks. Specifically, when a one-bit error occurs in such data, the error cannot and is not effectively corrected under certain circumstances.

For example, as explained in more detail below, if an error bit is found, the arrangement checks for the existence of the error by utilizing the parity bit. If the bit error is temporary, the transmitter retries transmitting the data in a software method so as to maintain the performance, but the error cannot be corrected. Therefore, if a one-bit error occurred, the system cannot maintain normal operation.

SUMMARY OF THE INVENTION

It is an object of the present invention to provide a circuit and method for correcting a one-bit error when a bit in the hardware of the system is fixed as 0 or 1 to generate an error in the parallel digital bus including a parity bit.

To achieve an object of the present invention, a preferred embodiment of an apparatus for correcting a one-bit error of a parallel digital bus includes: a transmitter; a first data corrector block for receiving the data from the transmitter so as to store the received data; a second data corrector block for receiving a signal from the transmitter so as to check for the existence of the parity error of the data received from the first data correction block and, if a parity error is found, modifying the received data; and a receiver for selectively receiving the data from the first data corrector block or the second data corrector block according to the existence of the parity error.

To achieve another object of the present invention, a preferred embodiment of a method for modifying a one-bit error in the parallel digital bus comprises the steps of: storing the data to a first data storage in a first data corrector, transmitting the data to a second data corrector; checking for a parity error in the transmitted data; storing the transmitted data to the second data storage; storing the transmitted data to the origins data storage; transmitting the data of the first data corrector to the receiver; if no parity error is found after checking the parity, shifting one bit of the data of the first data storage and tans the shifted data to the selector; if a parity error is found after checking the parity, shifting one bit of the data of the second data storage; if a parity error is found after checking the parity, modifying the error by utilizing the data stored in the first data storage, the data stored in the second data storage, and the data stored in the original data storage; selecting the data stored in the first data storage in the case of no error, or the modified data in the case of the existence of one error; and transmitting the selected data to the receiver.

Exemplars of recent efforts in the art include U.S. Pat. No. 4298982 for Fault-Tolerant Interface Circuit For Parallel Digital Bus issued to Auerbach. The aforementioned patent is different from the present invention in that the invention avoids the disadvantages of a complicated bus circuit and increasing bus error probability.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
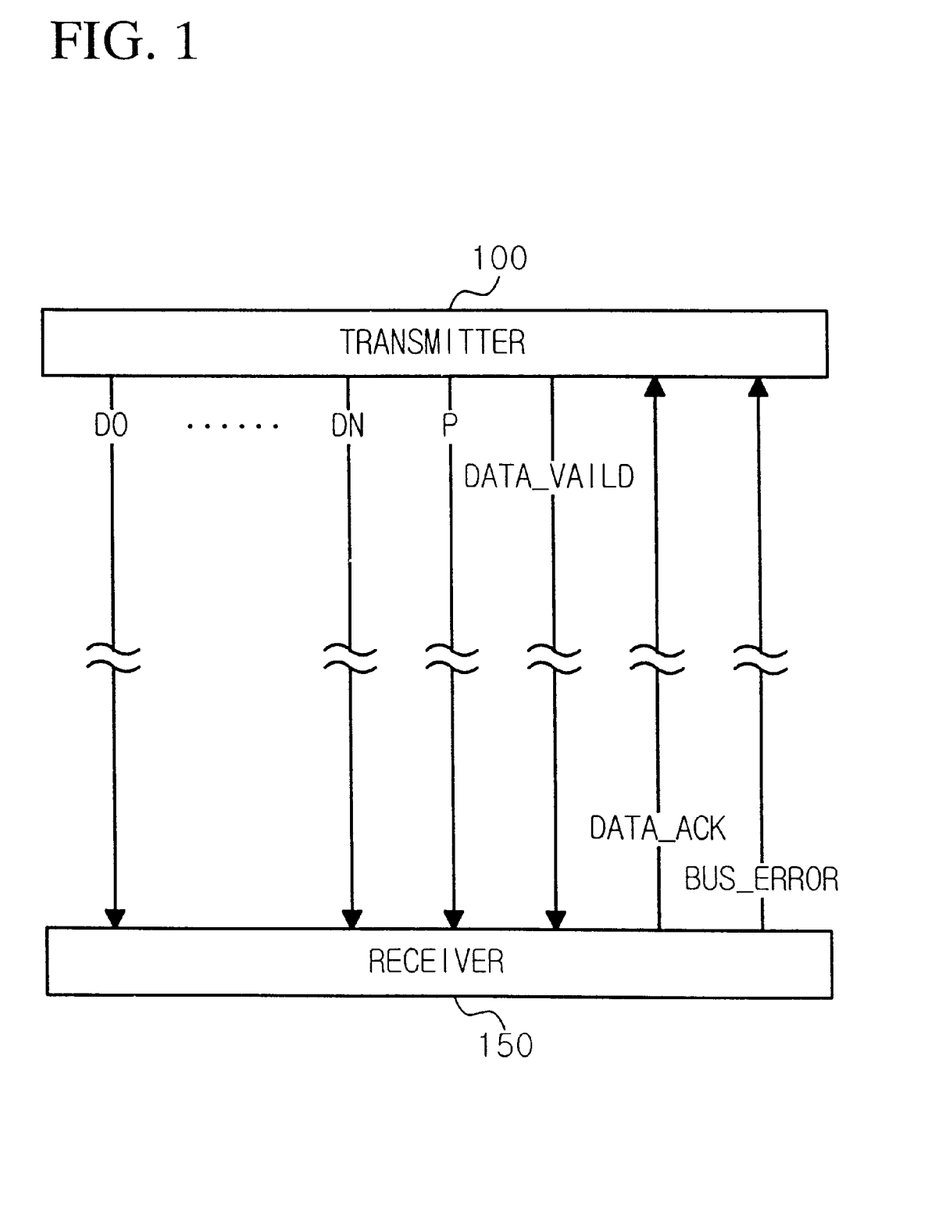
FIG. 1 is a schematic diagram of an error correction circuit for a parallel data bus.

Referring to FIG. 1, the transmitter 100 moves data by utilizing a parallel digital bus, and the receiver 150 answers a request from the transmitter 100.

The transmitter 100 transmits to the receiver 150 the data of [0. . . n] bits, a parity signal and a data_valid signal indicating that valid data is transmitted. Receiver 150 receives from the transmitter 100 a data_ack (data acknowledge) signal when the receiver 150 receives correct data, or a bus_error signal when the receiver 150 receives error data.

The receiver 150 receives from the transmitter 100 the data of [0. . . n] bits, a parity signal, and a data_valid signal, and transmits to the transmitter 100 a data_ack signal when the receiver 150 receives correct data, or a bus_error signal when the receiver 150 receives error data.

In the case of transmitting the data to the receiver 150 by utilizing a parallel digital bus, the transmitter 100 transmits the data together with a one-bit parity signal so as to check whether or not the data are transmitted without an error.

If an error bit is found, the arrangement checks for the existence of the error by utilizing the parity bit. If the bit error is temporary, the transmitter 100 retries transmitting the data in accordance with a software, method so as to maintain normal operation, but the error cannot be corrected. Therefore, if a one-bit error occurred, the system cannot maintain normal operation.

Figure 2:
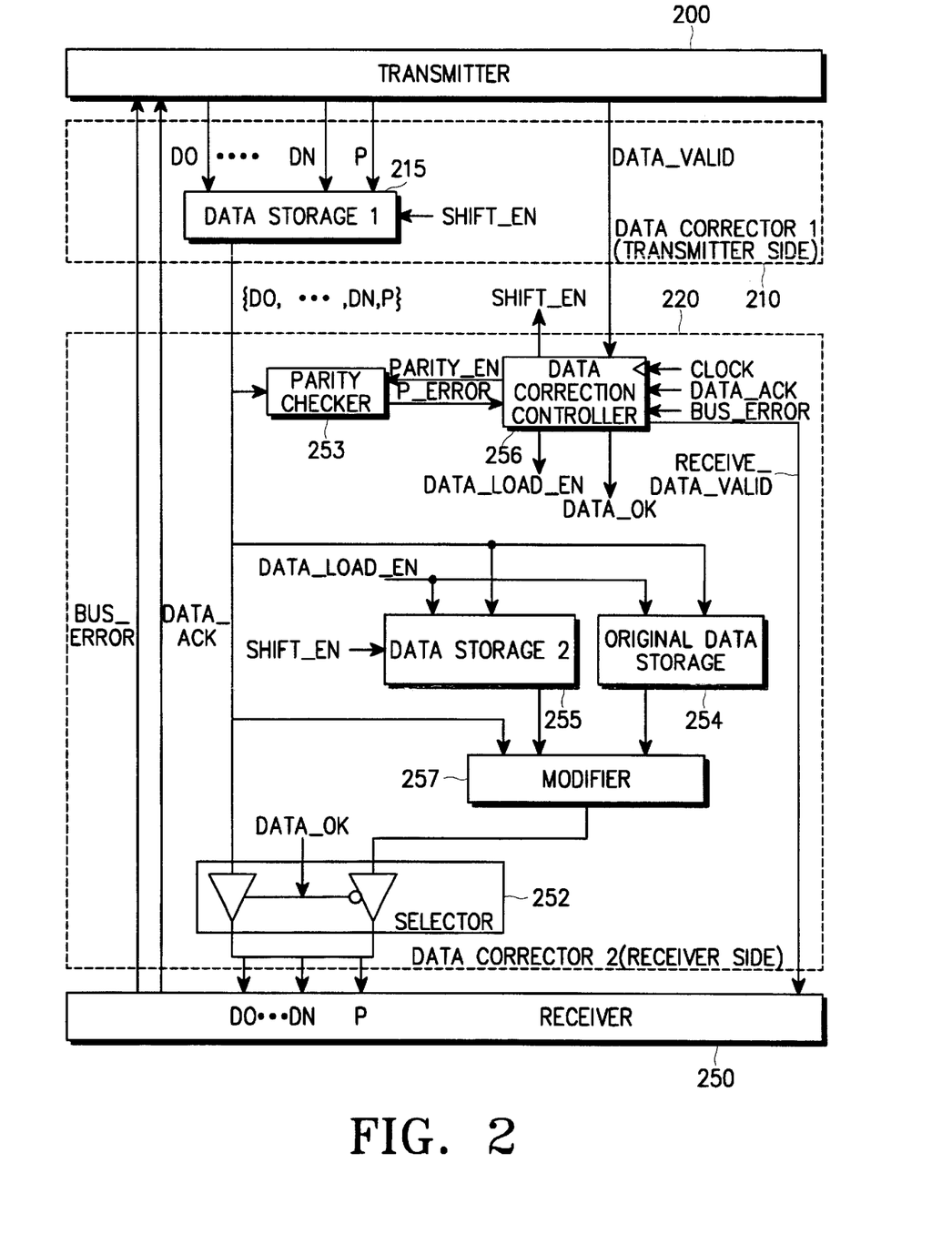
FIG. 2 is a schematic diagram of an error correction circuit for a parallel data bus according to the present invention.

Referring to FIG. 2, the transmitter 200 transmits the data and the parity signal to the Data Storage 1 (DS1) 215. When the transmitter transmits the data_valid signal to the Data Correction Controller (DCC) 256, the DCC 256 transmits the parity_en (parity enable) signal to the Parity Checker (PC) 253, and the data_load_en (data load enable) signal to the Data Storage 2 (DS2) 255 and the Original Data Storage (ODS) 254.

After receiving the parity_en, the PC 253 checks the parity of the data from the transmitter 200, and reports the result to the DCC 256 by utilizing the p_error signal. After receiving the data_load_en signal, the DS2 255 and the ODS 254 store the data from the transmitter 200.

If no parity error is found, the DCC transmits the data_ok signal to the Selector 252, and the receive_data_valid signal to the receiver 250. After receiving the data_ok signal, the Selector 252 enables the receiver 250 to receive the data from the DS2 255. Concurrently, after receiving the receive_data_valid signal, the receiver 250 receives the data from the DS2 255, and transmits the data_ack (data acknowledge) signal to the transmitter 200.

If a parity error is found, the DCC 256 transmits the shift_en (shift enable) signal to the DS1 215 and the DS2 255. Data in the DS1 215 and the DS2 255 are shifted and rotated by one-bit. The data in the ODS 254 is not changed, but keeps the original contents.

The modifier 257 compares the data in the DS1 215 and the data in the DS2 255 bit by bit so as to find the error bit.

After finding the error bit, the modified data is obtained by inverting the corresponding bit of the above-mentioned error bit in the data of the ODS 254. The DCC 256 transmits the receive_data_valid signal to the receiver 250, and the receiver 250 receives the error-modified data through the Selector 252.

In the case of two-bit or more errors, detection and correction of errors cannot be guaranteed. In that case, the receiver 250 transmits the bus_error signal to the transmitter 200.

Figure 3:
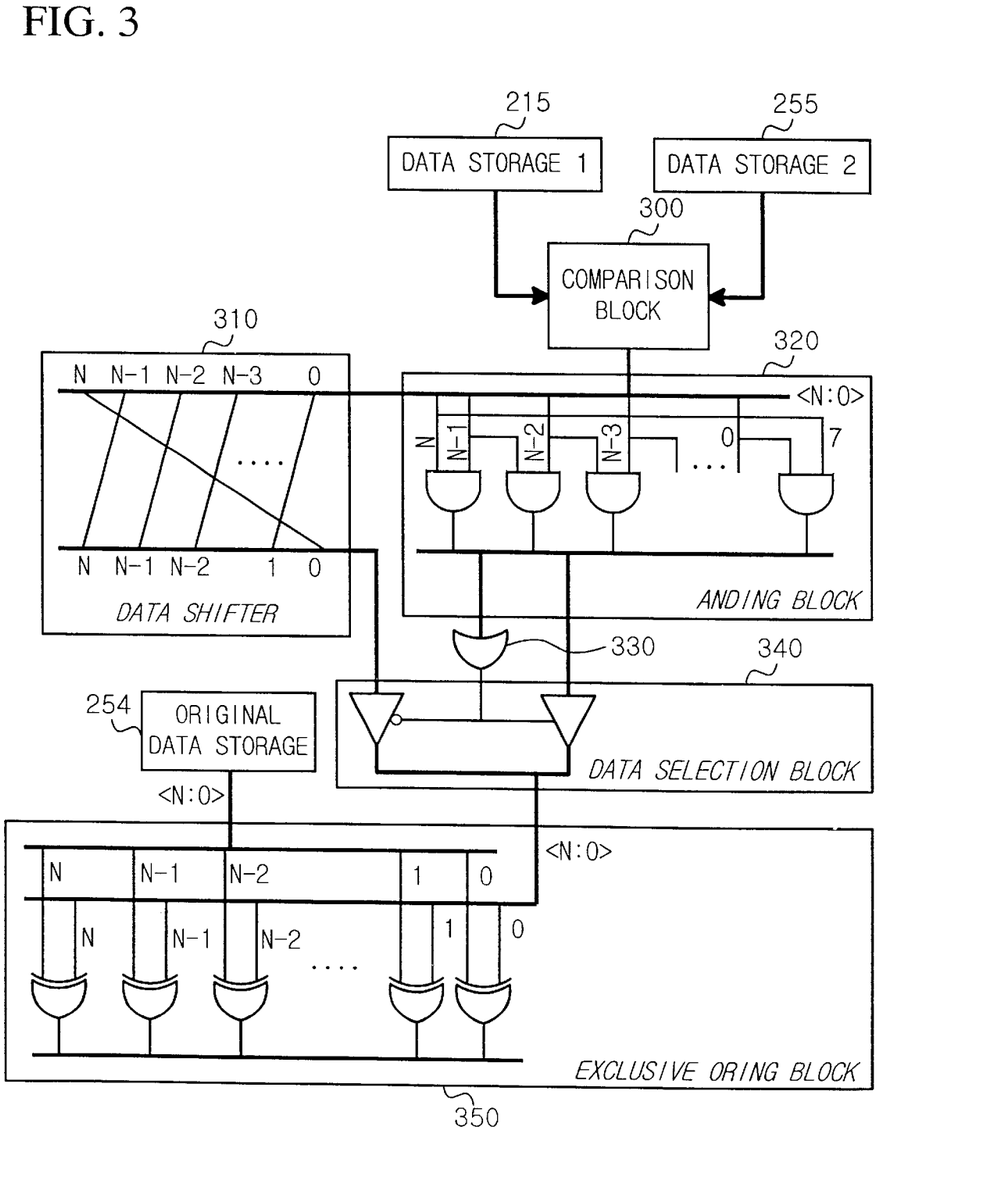
FIG. 3 is a detailed schematic diagram of a modifier according to the present invention.

FIG. 3 shows the detailed schematic diagram of the modifier 257 of FIG. 2 which modifies the error by utilizing data compared bit by bit.

In case of a one-bit error, two solutions are needed. One involves modification of the signals compared bit by bit in the Comparison Block (CB) 300. The other involves modification of two bits of the signals compared bit by bit in the CB 300.

Followings are two exemplary cases illustrating the above-noted two situations. Each case assumes that the third input bit of the eight-bit input data bus of the DC2 220 has a fixed '0' because of error in the hardware.

The first case involves modification of one bit. The transmitter 200 is assumed to transmit data [0011 0010]. The DS1 215 stores the transmitted data.

When the transmitter 200 transmits the data_valid signal to the DCC 256, the DCC 256 transmits the data_load_en signal to the DS2 255 and the ODS 254. Therefore, the DS2 255 and the ODS 254 receive the data from the DCC1 210. Since the third bit of the DCC2 220 is fixed as '0' in the hardware, each register stores data [0001 001].

The PC 253 reports the above-mentioned error to the DCC 256, and the DCC 256 transmits the shift_en signal to the DS1 215 and the DS2 255. Therefore, the DS1 215 has the data [0001 1001], and the DS2 255 shifts and rotates the previous data [0001 0010] by one bit, so as to store the data [0000 1001] to itself.

The Modifier 257 receives the data [0001 1001], which was provided to the DCC2 220, and the data [0000 1001] from the DS2 255. The CB 300 in the Modifier 257 compares these two data, bit by bit, to obtain the data [0001 0000]. If two bits are the same, the above bit is indicated as '0'; if two bits are different, the above bit is indicated as '1'. As a result of the comparison, the fourth bit is found to be not identical.

The Data Shifter 310 shifts to the left and rotates the data [0001 0000] by one bit to obtain [0010 0000]. Two-bit ANDing Block 320 ANDs the data [0001 0000] by adjacent two bits to obtain the data [0000 0000].

The result of ORing in OR gate 330 is also '0' and the Data Selection Block 340 transmits the data [0010 1111] of the Data Shifter 310 to the Exclusive ORing Block 350. In this case, the Data Shifter 310 (and not the AND in Block 320) functions as a Fault Bit Pointer.

Exclusive_ORing bit by bit of the data [0010 0000] from the DSB 340 and the data [0001 0010] from the ODS 254 results in the data [0011 0010]. Therefore, the error is corrected.

The second case involves modification of two bits. The transmitter 200 is assumed to transmit data [1111 1111]. The DS1 215 stores the transmitted data.

When the transmitter transmits the data valid signal to the DCC 256, the DCC 256 transmits the data_load_en signal to the DS2 255 and the ODS 254. Therefore, the DS2 255 and the ODS 254 receive data from the DCC1 210. Since the third bit of the DCC2 220 is fixed as '0' in the hardware, each register stores data [1101 1111].

The PC 253 reports the above-said error to the DCC 256, and the DCC 256 transmits the shift_en signal to the DS1 215 and the DS2 255. Therefore, the DS1 215 has the data [1111 1111], and the DS2 255 shifts and rotates the previous data [1101 1111] by one bit, to store the data [1110 1111] to itself.

The Modifier 257 receives the data [1101 1111] which was provided to the DCC2 220, and the data [1110 1111] from the DS2 255. The CB 300 in the Modifier 257 compares these two data bit by bit to obtain the data [0011 0000]. If the two bits are the same, the above bit is indicated as '0'; if the two bits are different, the above bit is indicated as '1'. As a result of the comparison, the third and fourth bits are found to be not identical.

The Data Shifter 310 shifts to the left and rotates the data [0011 0000] by one bit to obtain [0110 0000]. Two-bit ANDing Block 320 ANDs the data [0011 0000] by adjacent two bits to obtain the data [0010 0000].

The result of ORing in OR gate 330 is also '1' and the Data Selection Block 340 transmits the data [0010 0000] of the Data Shifter 310 to the Exclusive ORing Block 350. In this case, the ANDing Block 320 (and not Data Shifter 310) functions as the Fault Bit Pointer.

Exclusive_ORing bit by bit of the data [0010 0000] from the DSB 340 and the data [1101 1111] from the ODS 254 results in the data [1111 1111]. Therefore, the error is corrected.

Figure 4:
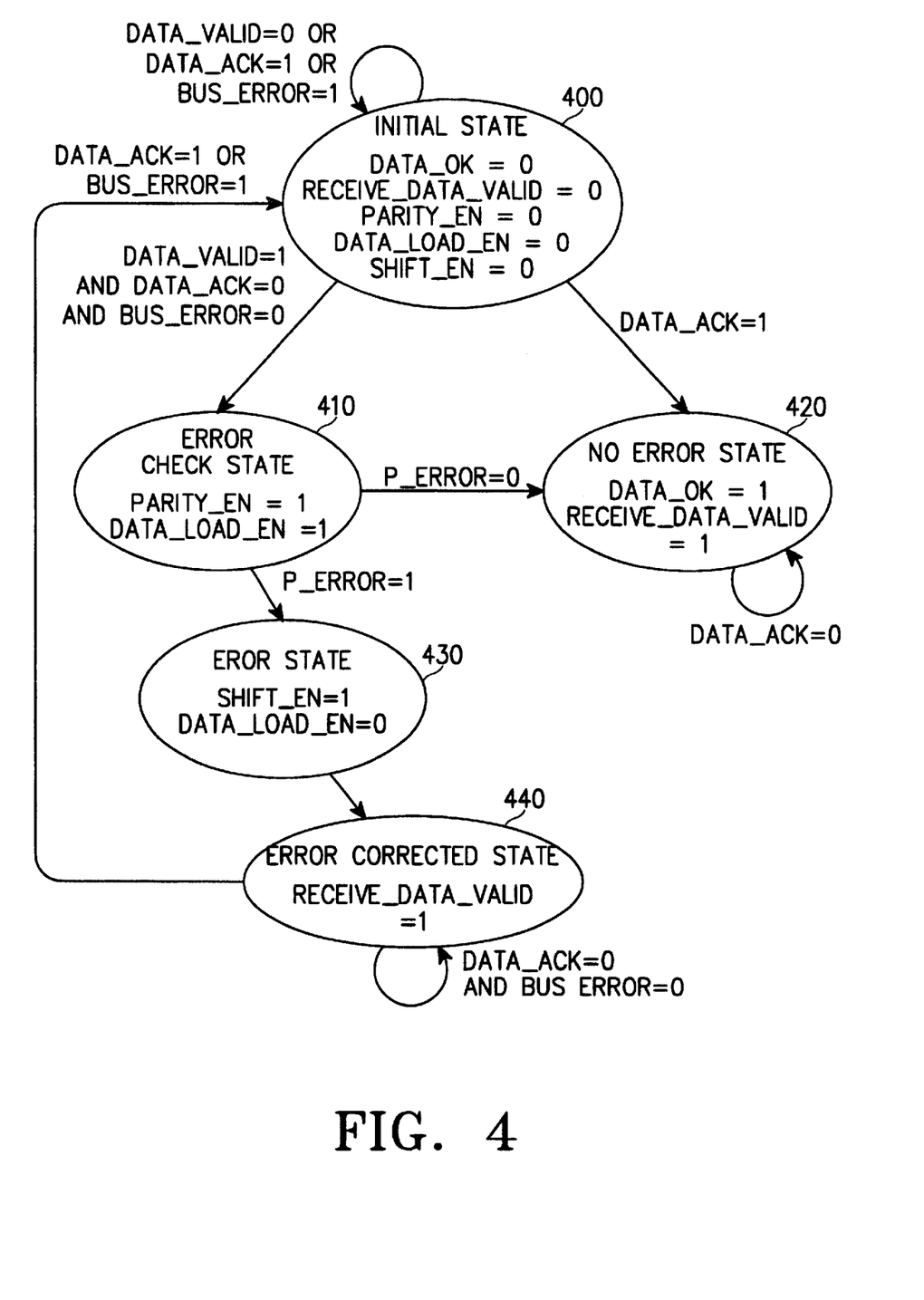
FIG. 4 is a state diagram of a data correction controller according to the present invention.

FIG. 4 is a state diagram of the Data Correction Controller 256 controlling the Data Corrector 2200.

As illustrated, in the Initial State 400, the commands data_ok, receive_data_valid, parity_en, data_load_en, shift_en, are logic '0'.

When the transmitter 200 transmits the data to the receiver 250, and when the transmitter 200 transmits the data_valid signal to the Data Correction Controller 256, the DCC 256 goes to the Error Check State 410 to generate the parity_en (enabling the parity check) signal and the data_load_en (enabling data storing) signal. The Parity Checker 253 checks the parity according to the parity_en signal. The Data Storage 2 (DS2) 255 and the Original Data Storage 254 store the data from the Data Storage 1 (DS1) 215 to themselves according to the data_load_en signal.

When no error is found after the parity check, the parity checker 253 transmits the p_error=0 signal to the DCC 256 which goes to the No Error State 420. The DCC 256 transmits the data_ok signal to the Selector 252 so that the Selector 252 may select the data from the DS1 215. The DCC 256 transmits the receive_data_valid signal to the receiver 250 so that the receiver 250 may receive the signal from the DCC 256. After receiving the data, the receiver 250 transmits the data_ack signal to the transmitter 200 so as to report that the receiving is finished.

When an error is found after the parity check, the parity checker 253 transmits the p_error=1 signal to the DCC 256 which goes to the Error State 430. When the DCC 256 transmits the shift_en signal to the DS1 215 and the DS2 255, both DS1 215 and DS2 255 shift and rotate their data by one bit.

After the error is modified, the DCC 256 goes to the Error Corrected State 440a transmits the receive_data_valid signal to the receiver 250 so that the receiver 250 may receive the data. After receiving the data, when the parity, has no errors, the receiver 250 transmits the data_ack signal to the transmitter 200 so as to report that the receiving is normally finished.

Figure 5:
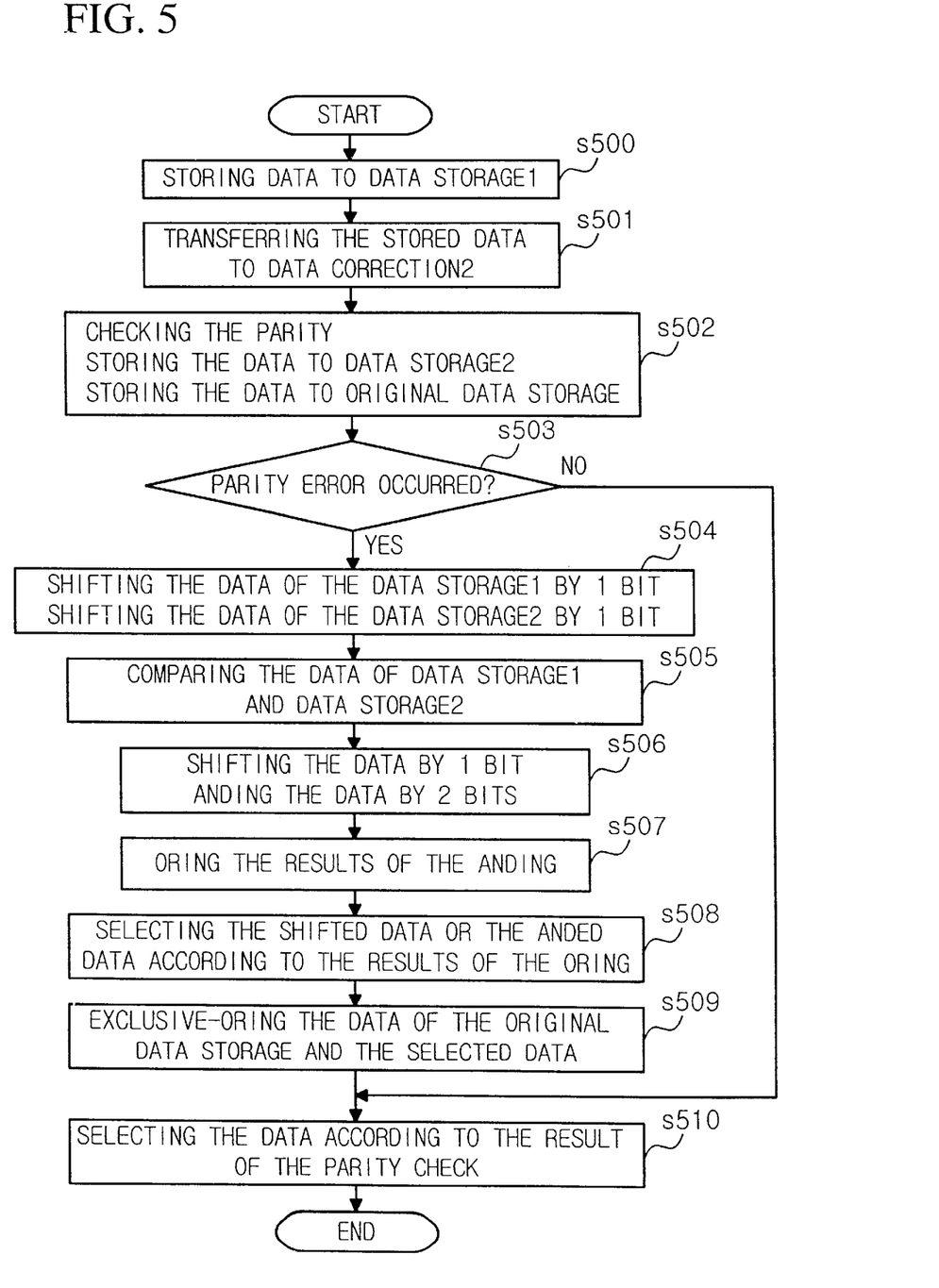
FIG. 5 is a flow chart of a method for correcting the error data bit according to the present invention.

FIG. 5 is a flow chart of the method for modifying the error data bit in the parallel digital bus.

The method comprises the steps of: storing the data to the DS1 215 of the Data Corrector 1 210 (step s500); transmitting the above data to the Data Corrector 2 220 (step s501); checking for the existence of an error in the transmitted data, and storing the transmitted data in the DS2 255 and the ODS 254 (step s502); after checking the parity error (step s503), if no parity error is found, transmitting the data of the Data Corrector 1 210 to the Selector 252, and, if a parity error is found, shifting the data of the DS2 255 by one bit so as to transmit the data to the Modifier 257 (step s504); comparing the data from the DS1 215 and the DS2 255 bit by bit (step s505); shifting the compared data by one bit, and ANDing the compared data by two bits (step s506); ORing the ANDed data (step s507); selecting either the one-bit shifted data or two-bit ANDed data according to the result of Oring (step s508); exclusive-ORing the selected data and the data from the ODS 254 (step s509); and, when no error is found, selecting the data from the DS1 215 or, when an error is found, selecting the error-corrected data (step s510).

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A one-bit fault-tolerant interface circuit for a parallel digital bus, comprising:
   a transmitter;
   a first data corrector block for receiving and storing data from said transmitter;
   a second data corrector block for receiving and storing said data stored by said first data corrector block, and responsive to a signal from said transmitter for checking for existence of a parity error in said data received from said first data corrector block, wherein, if the parity error is found, said second data corrector block modifies said received data; and
   a receiver for selectively receiving one of the data from said first data corrector block and the modified data from said second data corrector block according to the existence of the parity error;
   wherein said first data corrector block comprises a first data storage which receives the data from said transmitter, and which transmits said received data to said second data corrector block according to a signal from said transmitter;
   wherein said second data corrector block comprises a parity checker connected to said first data storage, and a data correction controller connected to said transmitter and said parity checker for transmitting a signal to said parity checker, said parity checker being responsive thereto for checking for the existence of the parity error after receiving a signal which indicates that the data was transmitted from said transmitter; and
   wherein said second data corrector block further comprises a modifier responsive to a finding of the parity error for receiving data shifted by said first data corrector block, for comparing said data shifted by said first data corrector block with other shifted data, and for comparing said compared data with non-shifted data so as to modify the parity error.

2. The circuit as set forth in claim 1, wherein said second data corrector block further comprises:
   an original data storage connected to said first data storage for storing data transmitted from said first data corrector block and comprising the non-shifted data;
   a second data storage connected to said first data storage for storing data transmitted from said first data corrector block, and, if the parity error is found after checking for the existence of the parity error, for shifting said data stored in said second data storage to obtain the other shifted data; and
   a selector connected to said first data storage and said modifier, and responsive to a finding of no parity error after checking for the existence of the parity error for transmitting the data of said first data storage to said receiver, and responsive to the finding of the parity error after checking the parity error for transmitting output data of said modifier to said receiver.

3. The circuit as set forth in claim 2, wherein said modifier comprises:
   a comparison block for comparing, bit by bit, the data of said first data storage and the data of said second data storage to obtain comparison data;
   a data shifter for shifting the comparison data;
   an ANDing block for ANDing respective serial two bits of said comparison data to obtain output data;
   an OR gate for ORing the output data from said ANDing block to obtain a control output;
   a data selection block for receiving data from said data shifter and the output data of said ANDing block so as to selectively output data of said data shifter and the output data of said ANDing block according to the control output of said OR gate; and
   an Exclusive-ORing block for exclusive-ORing a data output from said data selection block and the data stored in said original data storage.

4. The circuit as set forth in claim 1, wherein said other shifted data is stored in a second data storage in said second data corrector block, and said non-shifted data is stored in an original data storage in said second data corrector block.

5. A method for modifying a one-bit error in a parallel digital bus, comprising the steps of:

storing data to a first data storage in a first data corrector;
transmitting said data to a second data corrector;
checking for a parity error in said transmitted data;
storing said transmitted data in a second data storage;
storing said transmitted data in an original data storage;
transmitting the data of said first data corrector to a receiver when no parity error is found after checking for the existence of the parity error;
shifting one bit of the data of said first data storage to obtain shifted data;
transmitting said shifted data to a selector when the parity error is found after checking for the existence of the parity error;
shifting one bit of the data of said second data storage when the parity error is found after checking for the existence of the parity error;
modifying said parity error by utilizing the data stored in said first data storage, the data stored in said second data storage, and the data stored in said original data storage;
selecting the data stored in said first data storage when no error is found;
selecting modified data when the parity error is found; and
transmitting said selected data to said receiver;
wherein the step of modifying the parity error comprises the steps of:
  comparing, bit by bit, the data from said first data storage and the data from said second data storage to obtain comparison data;
  shifting one bit of said comparison data to obtain 1-bit-shifted data;
  ANDing respective serial two bits of said shifted comparison data to obtain 2-bit-ANDed data;
  ORing said 2-bit-ANDed data to obtain a result;
  selecting one of said 1-bit-shifted data and said 2-bit-ANDed data according to the result of said ORing step to obtain selected data; and
  exclusive-ORing said selected data and the data from said original data storage.

6. A one bit fault-tolerant interface circuit for a parallel digital bus, comprising:
  transmitter means for transmitting data;
  first data corrector means for receiving and storing the data from said transmitter means;
  second data corrector means for receiving and storing said data stored by said first data corrector means, and responsive to a signal from said transmitter means for checking for existence of a parity error in said data received from said first data corrector means, and for modifying said received data when the parity error is found; and
  receiver means for selectively receiving one of the data from said first data corrector means and the data from said second data corrector means according to nonexistence and existence, respectively, of the parity error;
  wherein said first data corrector means comprises a first data storage which receives data from said transmitter means, and which transmits said received data to said second data corrector means according to the signal from said transmitter means; and
  wherein said second data corrector means comprises a modifier and a selector, said modifier being responsive to a finding of the parity error after checking for the existence of the parity error for receiving data shifted by said first data corrector means, for comparing said data shifted by said first data corrector means with shifted data from a second data storage, and for comparing said compared data and data stored in an original data storage so as to modify the parity error, said selector being responsive to a finding of no parity error after checking for the existence of the parity error for transmitting the data of said first data storage to said receiver means, and responsive to finding of the parity error after checking for the existence of the parity error for transmitting output data of said modifier to said receiver means.

7. The circuit as set forth in claim 6, wherein said second data corrector means further comprises:
  a parity checker; and
  a data correction controller for transmitting a signal to said parity checker, said parity checker being responsive thereto for checking for the existence of the parity error after receiving a signal which indicates that the data was transmitted from said transmitter means;
  said original data storage storing data transmitted from said first data corrector means; and
  said second data storage storing the data transmitted from said first data corrector means, and, if the parity error is found after checking for the existence of the parity error, shifting said data stored in said second data storage to obtain shifted data.

8. The circuit as set forth in claim 7, wherein said modifier comprises:
  a comparison block for comparing, bit by bit, the data of said first data storage and the data of said second data storage to obtain comparison data;
  a data shifter for shifting the comparison data;
  an ANDing block for ANDing respective serial two bits of said comparison data to obtain output data;
  an OR gate for ORing the output data from said ANDing block to obtain a control output;
  a data selection block for receiving data from said data shifter and the output data of said ANDing block so as to selectively output data of said data shifter and the output data of said ANDing block according to the control output of said OR gate; and
  an Exclusive-ORing block for exclusive-ORing a data output from said data selection block and the data stored in said original data storage.

9. A method for correcting a one-bit error in a parallel digital bus, comprising the steps of:
  storing data in a first data storage;
  storing the data in a second data storage and in an original data storage;
  determining whether a parity error has occurred in the data;
  when the parity error has occurred, shifting the data stored in said first data storage and in said second data storage, respectively, by one bit to obtain shifted data, and modifying the parity error; and selecting modified data when the parity error has occurred, and selecting the data stored in the original data storage when the parity error has not occurred;

wherein the step of modifying the parity error comprises the steps of:

comparing, bit by bit, the data from said first data storage and the data from said second data storage to obtain comparison data;

shifting one bit of said comparison data to obtain 1-bit-shifted data;

ANDing respective serial two bits of said shifted comparison data to obtain 2-bit-ANDed data;

ORing said 2-bit-ANDed data to obtain a result;

selecting one of said 1-bit-shifted data and said 2-bit-ANDed data according to the result of said ORing step to obtain selected data; and     exclusive-ORing said selected data and the data from said original data storage.

* * * * *